(12) United States Patent
Baldwin, Jr.

(10) Patent No.: US 7,355,850 B2
(45) Date of Patent: Apr. 8, 2008

(54) VENTED AND DUCTED SUB-RACK SUPPORT MEMBER

(75) Inventor: Richard G. Baldwin, Jr., Austin, TX (US)

(73) Assignee: National Instruments Corporation, Austin, TX (US)

( * ) Notice: Subject to any disclaimer, the term of this patent is extended or adjusted under 35 U.S.C. 154(b) by 0 days.

(21) Appl. No.: 11/396,401

(22) Filed: Mar. 31, 2006

(65) Prior Publication Data

US 2007/0230119 A1 Oct. 4, 2007

(51) Int. Cl.
*H05K 7/20* (2006.01)
*H05K 5/00* (2006.01)

(52) U.S. Cl. .................... 361/695; 361/724; 361/752; 361/690; 454/184

(58) Field of Classification Search ............. 361/687, 361/694, 752, 756, 690, 695, 724; 211/41.17; 454/184; 312/223.2; 165/80.3
See application file for complete search history.

(56) References Cited

U.S. PATENT DOCUMENTS

| | | | |
|---|---|---|---|
| 4,293,891 A | | 10/1981 | Matsui et al. |
| 4,447,856 A | | 5/1984 | Takahashi et al. |
| 4,991,646 A | * | 2/1991 | Spears .................. 165/122 |
| 5,063,477 A | * | 11/1991 | Paggen et al. ............ 361/695 |
| 5,210,680 A | * | 5/1993 | Scheibler .................. 361/695 |
| 5,528,454 A | * | 6/1996 | Niklos ....................... 361/695 |
| 5,892,654 A | * | 4/1999 | Worden, Jr. ............... 361/690 |
| 5,969,942 A | * | 10/1999 | Heckner et al. .......... 361/695 |
| 6,000,464 A | * | 12/1999 | Scafidi et al. ......... 165/104.33 |
| 6,018,456 A | | 1/2000 | Young et al. |
| 6,047,836 A | * | 4/2000 | Miles ....................... 211/41.17 |
| 6,052,282 A | | 4/2000 | Sugiyama et al. |
| 6,128,187 A | * | 10/2000 | Mimlitch et al. .......... 361/690 |
| 6,151,213 A | * | 11/2000 | Ater et al. ................. 361/695 |
| 6,222,729 B1 | * | 4/2001 | Yoshikawa ................ 361/695 |
| 6,377,470 B1 | * | 4/2002 | Hayward et al. .......... 361/796 |
| 6,381,147 B1 | * | 4/2002 | Hayward et al. .......... 361/756 |
| 6,477,044 B2 | * | 11/2002 | Foley et al. ............... 361/695 |
| 6,580,616 B2 | | 6/2003 | Greenside et al. |
| 6,608,755 B2 | | 8/2003 | Baldwin et al. |
| 6,646,878 B2 | * | 11/2003 | Chan ........................ 361/695 |
| 6,698,079 B1 | * | 3/2004 | Mimlitch et al. ............ 29/462 |
| 6,780,043 B2 | * | 8/2004 | Malmberg .................. 439/377 |
| 6,796,444 B2 | * | 9/2004 | Tabuchi .................... 211/183 |

(Continued)

*Primary Examiner*—Jayprakash Gandhi
*Assistant Examiner*—Bradley H Thomas
(74) *Attorney, Agent, or Firm*—Meyertons Hood Kivlin Kowert & Goetzel, P.C.; Jeffrey C. Hood

(57) ABSTRACT

A chassis for plug-in modules may be provided with a vented and ducted sub-rack support member. The vented and ducted sub-rack support member may deflect a portion of the air flowing within the chassis through vents in the top surface of the vented and ducted sub-rack support member in order to increase the air flow to heat producing components mounted on the backplane above the support member. The increased air flow may increase air flow velocity and decrease the ambient temperature of the air around these components and improve the dissipation of heat from each component into the air. Air flow above the vented and ducted sub-rack support member may also be redirected by upper deflectors mounted on the support member to portions of plug-in cards adjacent to the upper deflectors and may provide additional cooling to components on the plug-in cards near the backplane.

23 Claims, 6 Drawing Sheets

U.S. PATENT DOCUMENTS

| | | |
|---|---|---|
| 6,912,131 B2 * | 6/2005 | Kabat .......................... 361/720 |
| 7,079,387 B2 * | 7/2006 | Brooks et al. .............. 361/687 |
| 7,167,363 B1 * | 1/2007 | Cushman et al. ........... 361/694 |
| 7,254,025 B2 | 8/2007 | Baldwin, Jr. |
| 2002/0006026 A1 * | 1/2002 | Takahashi et al. .......... 361/687 |
| 2002/0012238 A1 * | 1/2002 | Takahashi et al. .......... 361/796 |
| 2005/0047084 A1 * | 3/2005 | Kabat .......................... 361/690 |
| 2005/0286222 A1 * | 12/2005 | Lucero et al. .............. 361/690 |
| 2006/0171119 A1 | 8/2006 | Baldwin, Jr. |

* cited by examiner

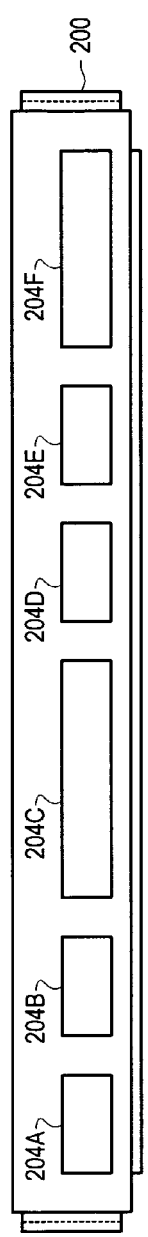
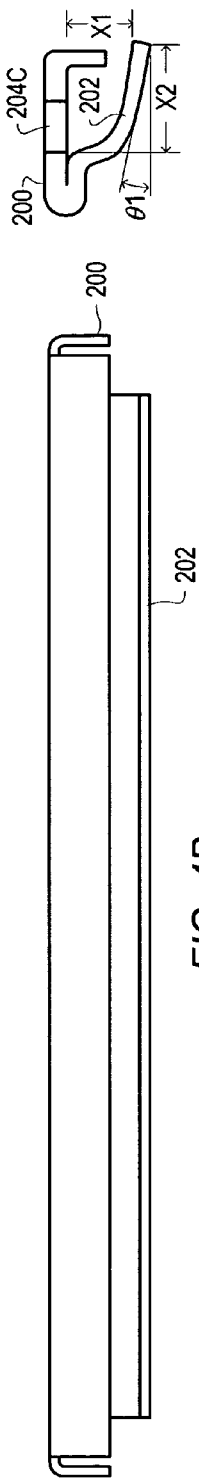
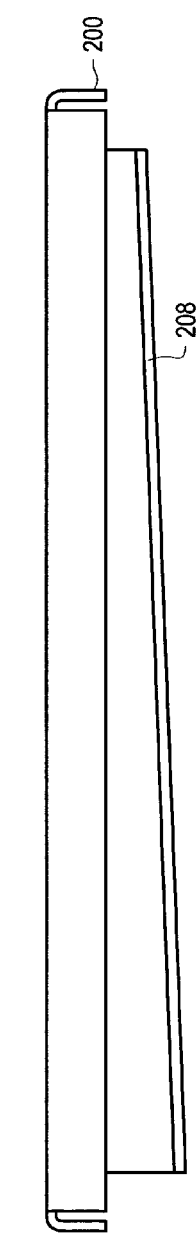
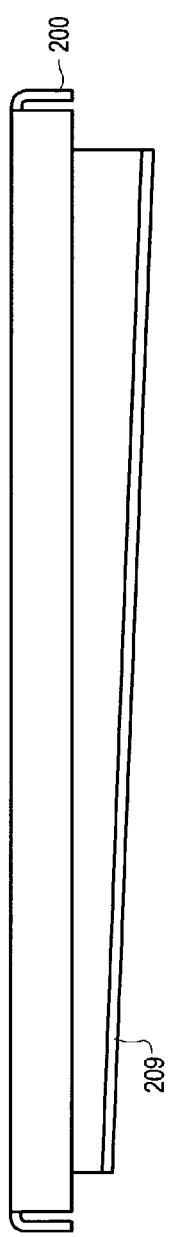

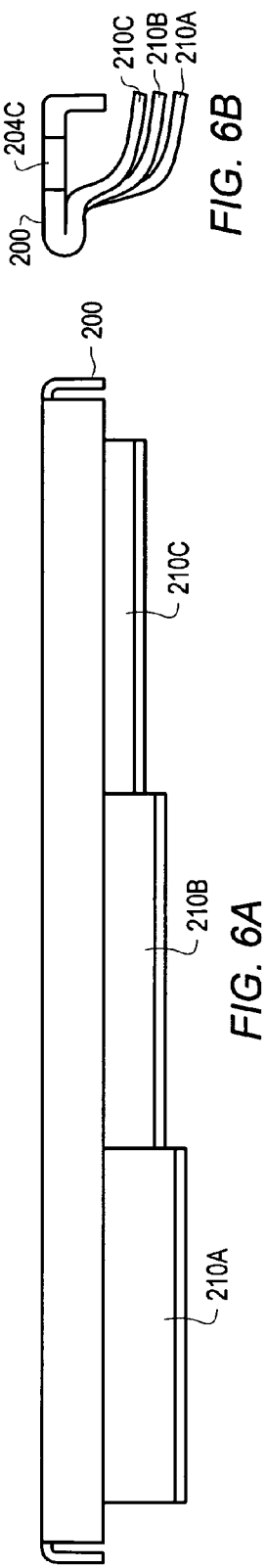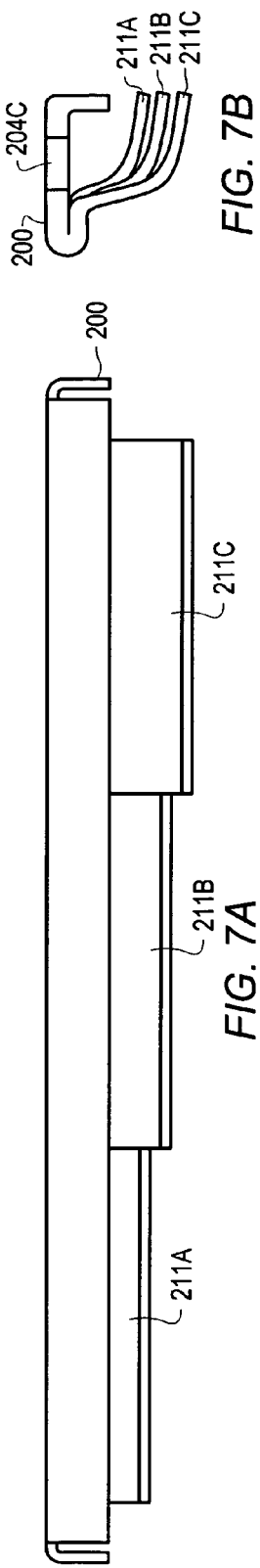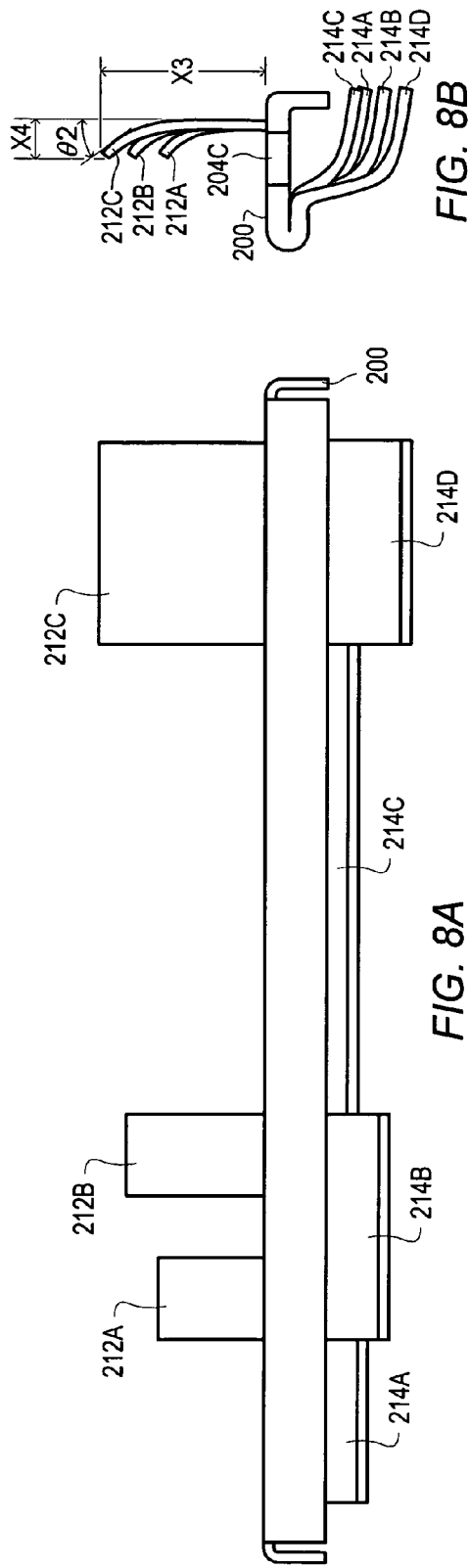

VENTED AND DUCTED SUB-RACK SUPPORT MEMBER

BACKGROUND OF THE INVENTION

1. Field of the Invention

The present invention relates generally to mechanisms for cooling heat producing components on electronic circuit boards, and more particularly, to the cooling of components by air flow generated by fans.

2. Description of the Related Art

Instruments for collecting data or information from an environment or unit under test may be coupled to and controlled by computer systems. Data collected by these instruments may be used to control units being tested (e.g., an overheated unit may be shutdown) or an environment (e.g., ventilation systems may be activated if a certain chemical is detected in the air). Data may also be displayed to a user for control and/or experimental purposes (e.g., to improve the design of the unit being tested). Instruments and/or computer systems may also perform various data analysis and data processing on acquired data prior to control of the unit and/or display of the data to the user. Examples of various types of instruments include oscilloscopes, digital multimeters, pressure sensors, etc., and the types of information that might be collected by respective instruments include voltage, resistance, distance, velocity, pressure, oscillation frequency, humidity or temperature, among others.

Instrumentation systems such as those described above may run on a platform such as PXI (Peripheral Component Interconnect (PCI) extensions for Instrumentation). PXI may combine a high-speed PCI bus with integrated timing and triggering features designed for measurement and automation applications to deliver performance improvements over other architectures. PXI may be built on a modular and scalable CompactPCI specification and the high-speed PCI bus architecture. As a result, PXI products may maintain interoperability with CompactPCI, offering increased mechanical integrity, easier systems integration, and more expansion slots than desktop computers. However, due to the compact design of these modules, parts of the module may be difficult to cool sufficiently.

FIG. 1A illustrates an exemplary chassis 100, e.g., a chassis conforming to any one of the following standards: VXI (Virtual Machine Environment (VME) extensions for Instrumentation), VME, CompactPCI, CompactPCI-Express, PXI, or PXI-Express. The chassis 100 includes a housing that is configured to define a plurality of slots. Each of exemplary plug-in modules 102A-C may be inserted into the plurality of slots of chassis 100.

FIG. 1B illustrates an internal structure of the exemplary chassis 100 showing plug-in module 102B inserted into the chassis 100. The plug-in module 102B may be guided during insertion into the chassis 100 by at least guide rails 104A-B until connectors 106 make connection. Connectors 106 may comprise a pair of connectors (not shown in FIG. 1B), one mounted on the plug-in module 102B and a mating connector mounted on the backplane 110. Additional circuitry 112 may be mounted behind the backplane 110 and may interact with the plug-in module 102B through the connectors 106. Backplane 110 and guide rails 104A-B may be coupled or attached to sub-rack support members 116 and 117. Pusher fan 114 may force air into the chassis 100 and under the support member 116 (arrows indicate typical air flow). Air flowing under the support member 116 may be redirected by vanes 118A and 118B and deflector 120 toward heat producing components of plug-in module 102B.

It is desirable to mount additional heat producing components on the front of the backplane 110 (such as: electronic switches and/or bridges). However, the air flow depicted in FIG. 1B may be ineffective in providing sufficient cooling to heat producing components mounted on the front of backplane 110 or mounted near the connector end of plug-in module 102B. Air flow eddies swirling in the region of components mounted on the backplane 110 trap the additional heat produced by these components and generate an elevated ambient air temperature in the air surrounding the components. The resulting excessive component temperatures may result in shorter component lives and/or unexpected failures.

SUMMARY OF THE INVENTION

A chassis for plug-in modules may be provided with a vented and ducted sub-rack support member. The vented and ducted sub-rack support member may deflect a portion of the air flowing within the chassis through vents in the top surface of the vented and ducted sub-rack support member in order to increase the air flow to heat producing components mounted on or near the backplane above the support member. The increased air flow may increase air flow velocity and decrease the ambient temperature of the air around the components and improve the dissipation of heat from the components into the air. Air flow above the vented and ducted sub-rack support member may also be redirected by upper deflectors mounted on the support member to portions of plug-in modules (also referred to herein as plug-in cards) adjacent to the upper deflectors and may provide additional cooling to components on the plug-in cards near the backplane.

One or more fans may force air into or out of the chassis to provide air flow within the chassis. A portion of the air flow within the chassis is diverted through the vented and ducted sub-rack support member to provide cooling to heat producing electronic or electrical components mounted on the front of the backplane or mounted near the backplane on plug-in cards.

Vents in the top surface of the "vented and ducted sub-rack support member" may correspond in size and position with an air flow channel between two adjacent plug-in cards or may span two or more adjacent air flow channels between three or more plug-in cards. A scoop portion of the vented and ducted sub-rack support member forms a channel (also referred to herein as a duct) beneath the vented and ducted sub-rack support member that may direct air flow through the air flow vents. The air flow through the air flow vents may be optimized by varying the design of the scoop portion of the vented and ducted sub-rack support member.

The air velocity generated by the fans may vary with position along the length of the scoop portion of the vented and ducted sub-rack support member. An angled scoop portion may compensate for this variation so that the velocity of the air flowing through the vents may be approximately uniform along the length of the vented and ducted sub-rack support member.

In some embodiments, the air flow through specific vents may be adjusted by providing several segmented scoop portions. These scoop designs may provide selected channels between specific plug-in cards with different air flows to achieve different cooling capabilities in the selected channels.

Some of the embodiments of the vented and ducted sub-rack support member may have a plurality of upper deflectors. The upper deflectors may be attached to the support member and positioned on the support member adjacent to selected vents to direct cooling air flows from the vents toward specific portions of the channels between plug-in cards adjacent to each of the upper deflectors. In still other embodiments, the upper deflectors may be provided without a bend allowing a customer to custom bend the upper deflectors to cool specific parts on adjacent plug-in cards.

In some embodiments, vent blockers may be provided to enable a customer to selectively block one or more of the vents in the support member. Blocking one or more vents may increase air flow through the remaining unblocked vents. Vent blockers may be snapped into any of the one or more vents and later one or more of the vent blockers may be removed to achieve a different configuration of open vents. Other means of attachment of the vent blockers to the support member are possible and contemplated.

BRIEF DESCRIPTION OF THE DRAWINGS

A better understanding of the present invention may be obtained when the following detailed description is considered in conjunction with the following drawings, in which:

FIG. 4A illustrates one embodiment of air flow vents 204A-F in a top view of the vented and ducted sub-rack support member 200;

FIG. 4B illustrates a rear view of one embodiment of a vented and ducted sub-rack support member 200 showing a scoop portion 202 of the vented and ducted sub-rack support member 200;

FIG. 4C illustrates a cross-sectional view through vent 204C of the vented and ducted sub-rack support member 200, showing one embodiment of a scoop portion 202 forming a duct in the vented and ducted sub-rack support member 200;

FIG. 5A illustrates a rear view of one embodiment of a scoop portion 208 with a linearly varying gap in the vented and ducted sub-rack support member 200;

FIG. 5B illustrates a rear view of another embodiment of a scoop portion 209 with a linearly varying gap in the vented and ducted sub-rack support member 200;

FIG. 6A illustrates a rear view of one embodiment of a vented and ducted sub-rack support member 200 with several segmented scoop portions 210A-C;

FIG. 6B illustrates a cross-sectional view through vent 204C of one embodiment of a vented and ducted sub-rack support member 200 with segmented scoop portions 210A-C;

FIG. 7A illustrates a rear view of one embodiment of a vented and ducted sub-rack support member 200 with segmented scoop portions 211A-C;

FIG. 7B illustrates a cross-sectional view through vent 204C of one embodiment of a vented and ducted sub-rack support member 200 with segmented scoop portions 211A-C;

FIG. 8A illustrates a rear view of one embodiment of a vented and ducted sub-rack support member 200 with segmented scoop portions 214A-D and upper deflectors 212A-C; and FIG. 8B illustrates a cross-sectional view through vent 204C of one embodiment of a vented and ducted sub-rack support member 200 with segmented scoop portions 214A-D and upper deflectors 212A-C.

Figure 1A:
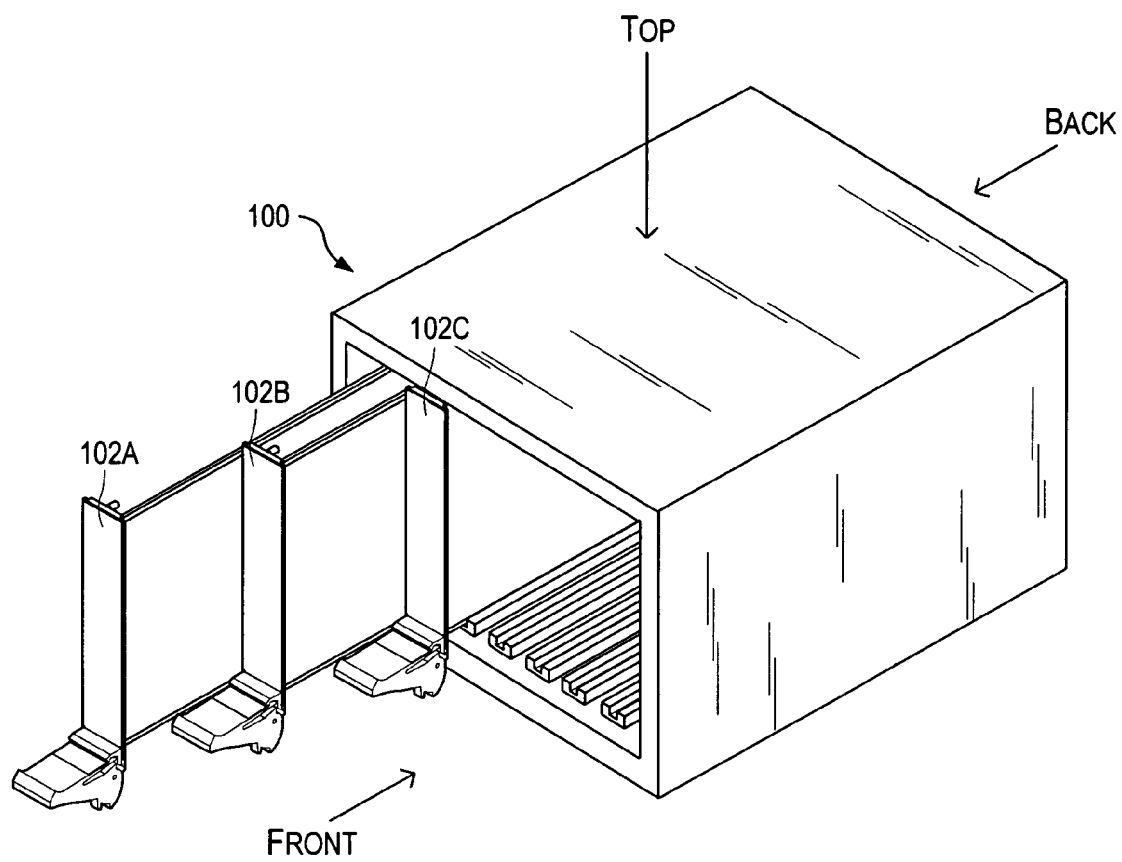
FIG. 1A illustrates an exemplary prior art chassis 100 and plug-in modules 102A-C.
Figure 1B:
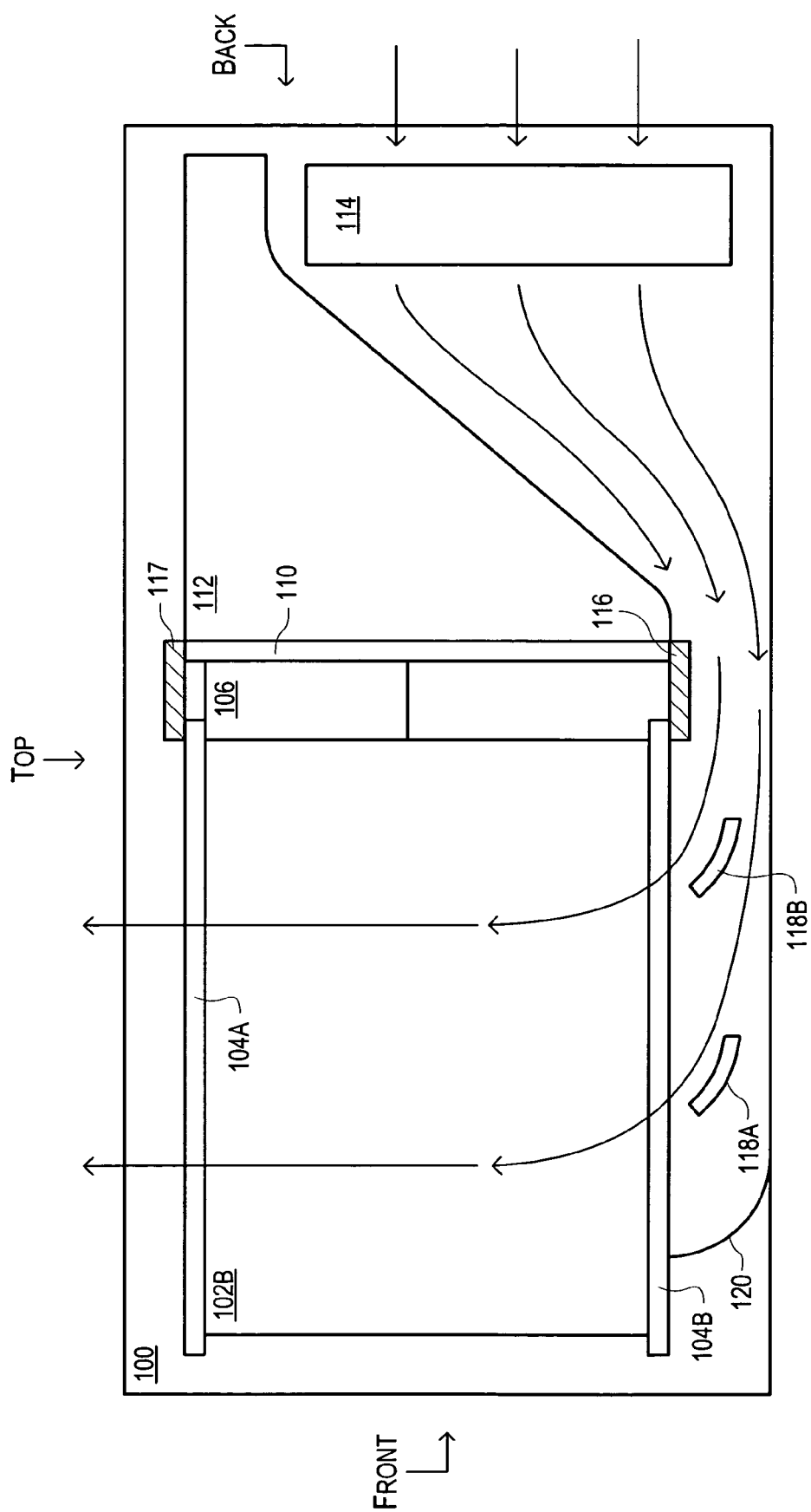
FIG. 1B illustrates internal air flow in a cross-sectional view of an exemplary prior art chassis 100.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as described by the appended claims. As used herein, the term "connected" means "directly or indirectly connected", and the term "coupled" means "directly or indirectly connected".

DETAILED DESCRIPTION OF THE INVENTION

Vented and Ducted Sub-Rack Support Member

Figure 2:
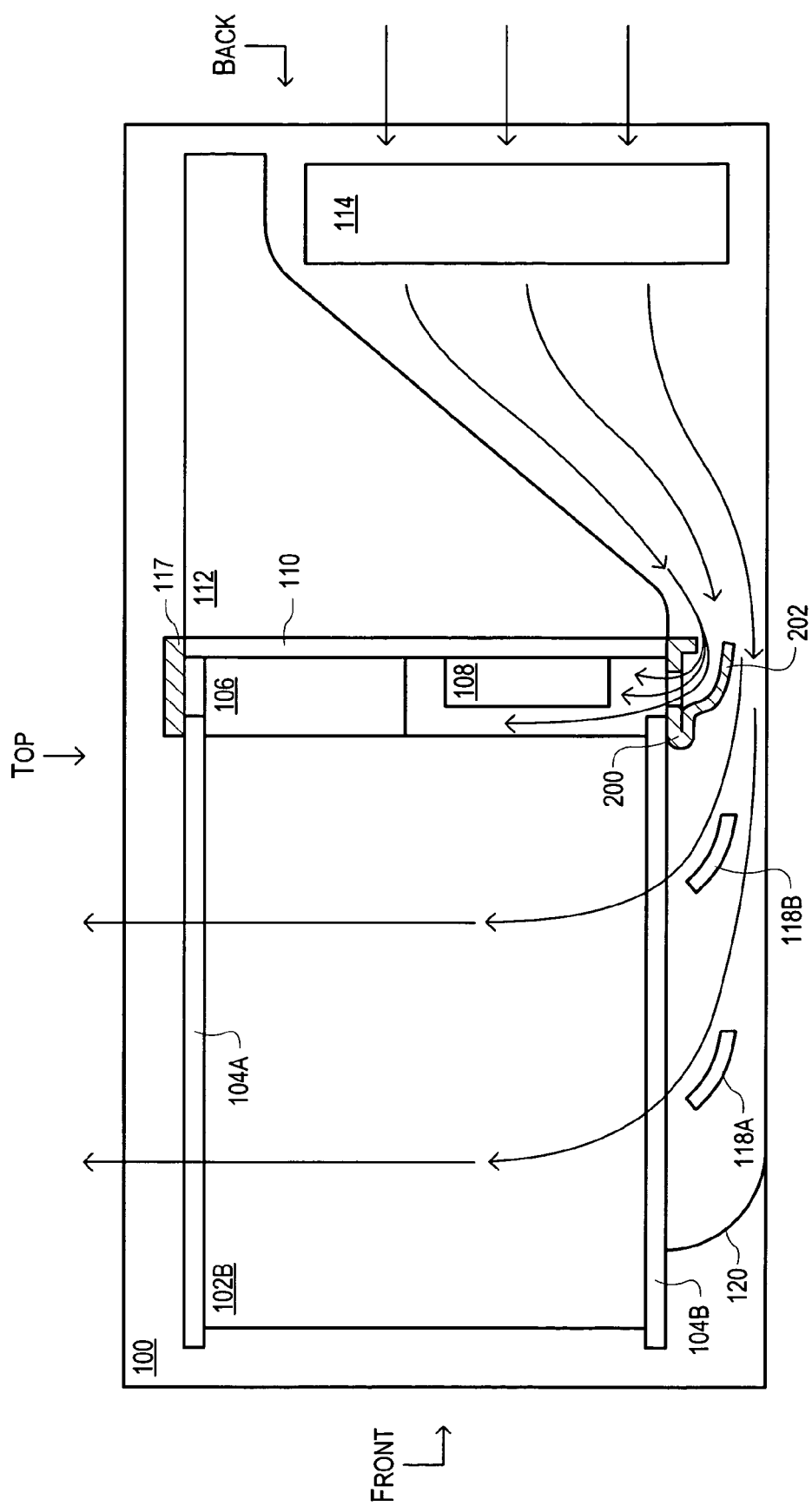
FIG. 2 illustrates internal air flow in a cross-sectional view of a chassis 100 provided with one embodiment of a vented and ducted sub-rack support member 200.

FIG. 2 illustrates one set of embodiments of an internal structure of a chassis 100 designed to receive plug-in modules, such as plug-in module 102B. The plug-in module 102B may be guided during insertion into the chassis 100 by at least guide rails 104A-B until connectors 106 make connection. Connectors 106 may comprise a pair of connectors (not shown in FIG. 2), one mounted on the plug-in card 102B and a mating connector mounted on the backplane 110. Additional circuitry 112 may be mounted behind the backplane 110 and may interact with the plug-in card 102B through the connectors 106. Backplane 110 and guide rail 104B may be coupled to vented and ducted sub-rack support member 200 (also referred to herein as support member 200). One or more fans 114 may force air into the chassis 100 and toward the support member 200 (arrows indicate typical air flow). A scoop portion 202 (also referred to herein as scoop 202, scoop 208, scoop 209, scoops 210A-C, scoops 211A-C, or scoops 214A-D) of support member 200 redirects a portion of this air flow up through vents 204A-F (shown in FIG. 4A) in support member 200 to provide cooling to heat producing electronic components 108 (e.g., electronic switches and/or bridges) mounted on the front of backplane 110. The remaining portion of the air flow generated by fans 114 flows under the support member 200 and may be redirected by vanes 118A, 1181B, and deflector 120 toward heat producing components mounted on plug-in card 102B.

The vented and ducted support member 200 may also be effective in providing cooling to heat producing electrical and electronic components mounted near the connector end of plug-in card 102B.

In other embodiments, the one or more fans 114 may be located above the plug-in cards 102A-C and pull air through the chassis and through the vents 204A-F in the support member 200 to provide cooling to heat producing electrical and electronic components mounted on the front of backplane 110 and near the connector end of plug-in card 102B.

In still other embodiments, the one or more fans 114 (and/or other fans) may both push and pull air through the chassis and through the vents 204A-F in the support member 200 to provide cooling to heat producing electrical and electronic components mounted on the front of backplane 110 and near the connector end of plug-in card 102B.

FIG. 4A illustrates one embodiment of air flow vents 204A-F in a top view of the vented and ducted sub-rack support member 200. Air flow vents 204A-F may also be referred to as air flow apertures or air flow holes. Air flow vents 204A,B,D, & E may each correspond in size and position with an air flow channel between adjacent plug-in cards. Air flow vents 204C and 204F may each span two or more adjacent air flow channels between three or more plug-in cards. FIG. 4B illustrates a rear view of one embodiment of a vented and ducted sub-rack support member showing a scoop portion 202 of the sub-rack support member 200. FIG. 4C illustrates a cross-sectional view through vent 204C of one embodiment of the vented and ducted sub-rack support member 200. Scoop portion 202 of support member 200 forms a duct in the vented and ducted sub-rack support member 200 that may channel air flow through the air flow vents 204A-F. The air flow through air flow vents 204A-F may be optimized by appropriate choices of parameters such as parameters X1, X2, and angle theta1, which define the shape of the duct formed by scoop 202.

In some embodiments, vent blockers may be provided to enable a customer to selectively block one or more of the air flow vents 204A-F in the support member 200. Blocking one or more of the air flow vents 204A-F may increase air flow through the remaining unblocked vents. Vent blockers may be snapped into any of the one or more air flow vents 204A-F and later one or more of the vent blockers may be removed to achieve a different configuration of open vents. Other means of attachment of the vent blockers to the support member 200 are possible and contemplated.

The air velocity generated by the pusher fans 114 may vary with position along the scoop portion 202 of support member 200. FIG. 5A illustrates a rear view of one embodiment of a scoop portion 208 of support member 200 with a linearly varying height of the duct (also referred to as a gap) formed by the scoop portion 208. In this embodiment, a larger gap is placed where the air velocity is lower, and a smaller gap is placed where the air velocity is higher. An angle of the scoop 208 may be selected so that the velocity of the air flowing through the vents 204A-F may be approximately uniform along the length of the support member 200. FIG. 5B illustrates a rear view of another embodiment of a scoop portion 209 of the support member 200 for an air flow generated by the pusher fans 114 that may also vary approximately linearly with position along the scoop portion 209, but with a mirror image variation compared to FIG. 5A.

FIG. 6A and FIG. 7A illustrate rear views of two embodiments of a vented and ducted sub-rack support member 200 with several segmented scoop portions 210A-C. These scoop designs 210A-C and 211A-C may provide selected channels (or groups of channels) between specific plug-in cards with different air flows to achieve different cooling capabilities in the selected channels. FIG. 6B and FIG. 7B illustrate cross-sectional views through vent 204C of the embodiments of the vented and ducted sub-rack support member 200 depicted in FIG. 6A and FIG. 7A, respectively.

Vented and Ducted Sub-Rack Support Member with Upper Deflector

Figure 3:
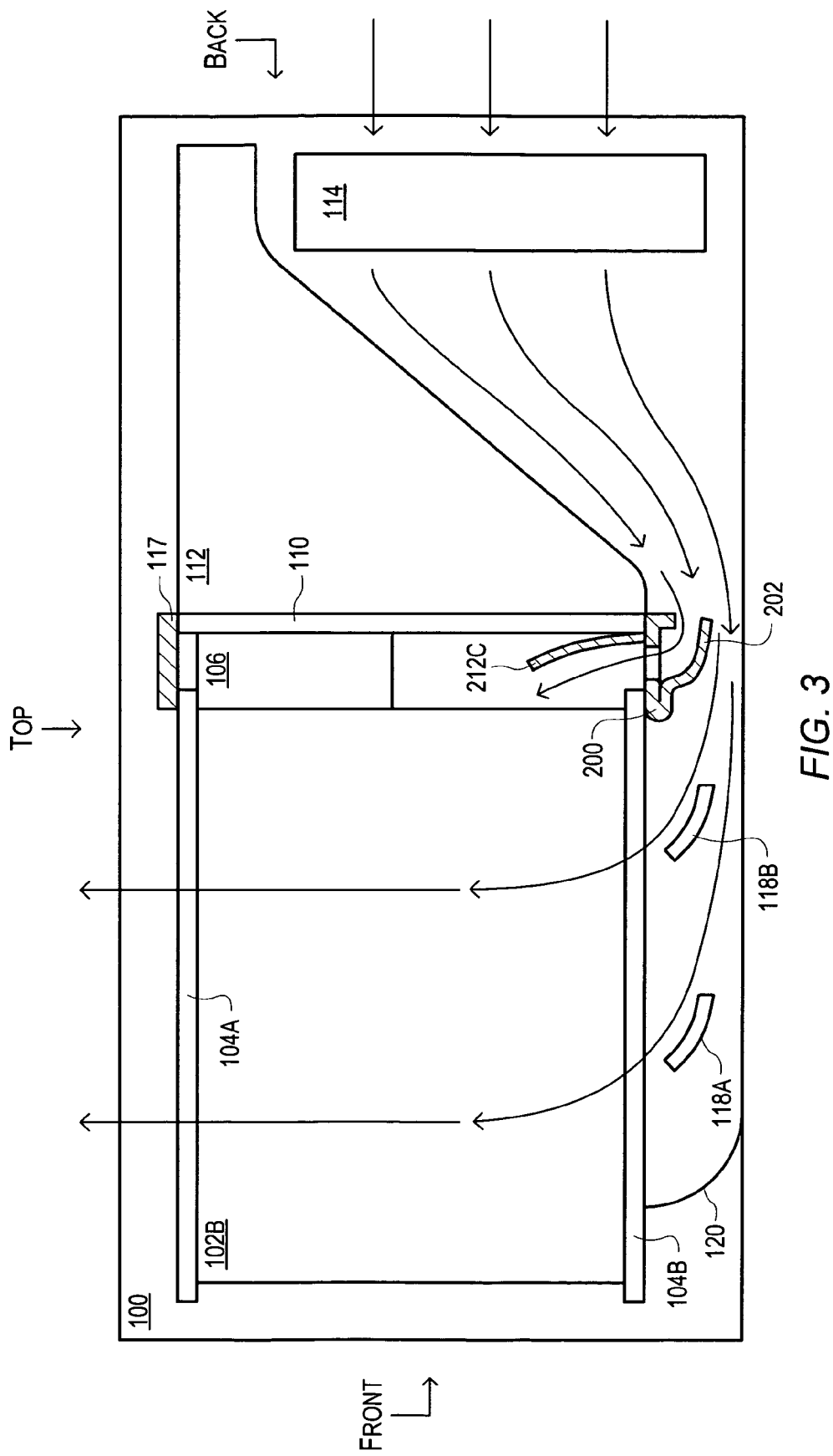
FIG. 3 illustrates internal air flow in a cross-sectional view of a chassis 100 provided with one embodiment of a vented and ducted sub-rack support member 200 with an additional upper deflector 212C.

FIG. 3 illustrates internal air flow in a cross-sectional view of a chassis 100 provided with another set of embodiments of a vented and ducted support member 200 with an additional upper deflector 212C that may be effective in providing enhanced cooling to heat producing electrical and electronic components mounted near the connector end of plug-in card 102B. The upper deflector 212C may be attached to support member 200 and positioned on support member 200 adjacent to one vent of the vents 204A-F depicted in FIG. 4A. This placement of upper deflector 212C may deflect the air flow from the one vent and direct the air flow into a channel between two adjacent plug-in cards.

FIG. 8A illustrates a rear view of one embodiment of a vented and ducted sub-rack support member 200 with a plurality of segmented scoop portions 214A-D and a plurality of upper deflectors 212A-C. FIG. 8B illustrates a cross-sectional view through vent 204C of the one embodiment. Scoop design parameters such as parameters X3, X4, and angle theta 2 may be optimized for each of the upper deflectors 212A-C to direct cooling air flows toward a specific portion of the channels between plug-in cards adjacent to each of the upper deflectors 212A-C.

In another embodiment, the upper deflectors 212A-C may be provided without a bend allowing a customer to custom bend the upper deflectors 212A-C to cool specific parts on adjacent plug-in cards.

Support member 200 may be manufactured from one material or combinations of various materials including: metals, sintered powdered metals, insulators, injection molded plastic, and composites. Support member 200 may be manufactured by any of various processes including: extrusion with secondary machining, casting, stamping and forming of sheet metal, injection molding, molding/sintering of sintered powdered metals, or combinations of these or other processes. Support member 200 may be one piece or an assembly of several pieces. In one embodiment, for instance, the scoop 202 and/or upper deflectors 212A-C may be molded from plastic and attached to a support member 200 by any of several known assembly techniques. In another embodiment, the scoop 202 may be formed from metal and spot welded or riveted to the support member 200.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as embodiments. Elements and materials may be substituted for those illustrated and described herein, steps in processes and procedures may admit permutation of order, and certain features of the invention may be utilized independently, all as would be apparent to one skilled in the art after having the benefit of this description of the invention. Changes may be made in the elements described herein without departing from the spirit and scope of the invention as defined in the following claims.

What is claimed is:

1. A sub-rack device, comprising:
   a backplane;
   a first member having a first side positioned above or below the backplane and having one or more vents; and
   a scoop coupled to a second side of the first member opposite said first side, wherein the scoop is configured to direct air flow through at least one of the one or more vents and onto and/or near the backplane; and a deflector coupled to said first side of the first member and configured to direct at least a portion of the air flow from at least one of the one or more vents at a non-perpendicular angle to a surface of the first member.

2. The device of claim 1, further comprising one or more heat generating components mounted to the backplane; wherein the scoop is configured to direct at least a portion of the air flow onto at least one of the one or more heat generating components mounted to the backplane.

3. The device of claim 1, wherein the scoop is configured to compensate for a cooling air flow having air velocity that varies spatially along the length of the scoop, in order to provide an approximately uniform air velocity from each of the one or more vents.

4. The device of claim 1, wherein the scoop is configured to provide air flow with a different air velocity from each vent of the one or more vents.

5. The device of claim 1, wherein the first member and the scoop are one piece.

6. The device of claim 1, wherein the first member is fabricated from one or more materials from a set of materials comprising: metal, sintered powdered metal, composites, or plastic.

7. The device of claim 1, wherein the scoop is fabricated from one or more materials from a set of materials comprising: metal, sintered powdered metal, composites, or plastic.

8. The device of claim 1, wherein said scoop comprises a plurality of scoops, and wherein each scoop of the plurality of scoops is coupled to a corresponding different portion of the first member.

9. The device of claim 8, wherein each scoop of the plurality of scoops is configured to direct at least a portion of the air flow through a corresponding one or more vents of the one or more vents, and wherein the corresponding one or more vents are located within the corresponding different portion of the first member.

10. The device of claim 1, wherein the deflector, the first member, and the scoop are one piece.

11. The device of claim 1, wherein the first member is mounted in a chassis, and wherein the chassis is configured to receive plug-in modules.

12. The device of claim 1, wherein the scoop is segmented into a plurality of scoop portions and wherein at least two of the plurality of scoop portions are operable to be separately bent by the user to deflect at least a portion of the air flow in different desired directions.

13. The device of claim 1, wherein the one or more vents comprises at least two or more different sized vents and wherein the scoop is operable to direct at least a portion of the air flow through the at least two different sized vents.

14. An apparatus, comprising:
a chassis;
a sub-rack support member mounted within the chassis;
a backplane coupled to a first side of the sub-rack support member, wherein the backplane comprises a front surface and a back surface;
one or more fans coupled to the chassis, wherein the one or more fans are operable to direct air toward the back surface of the backplane;
one or more heat generating components mounted on at least the front surface of the backplane, wherein the sub-rack support member is configured with one or more vents to facilitate a dissipation of heat from the one or more heat generating components; and
a scoop coupled to a second side of the sub-rack support member opposite said first side and oriented to direct at least a portion of the air from the one or more fans through at least one of the one or more vents onto at least one of the one or more heat generating components mounted to the front surface of the backplane to facilitate the dissipation of heat from the one or more heat generating components mounted to the front surface of the backplane.

15. The apparatus of claim 14, wherein the backplane is configured to connect to one or more plug-in cards.

16. The apparatus of claim 15, further comprising one or more deflectors coupled to the sub-rack support member, wherein at least one of the one or more deflectors is configured to redirect air flow from an adjacent one of the one or more vents toward at least one of the one or more plug-in cards.

17. The apparatus of claim 14, wherein one or more of the vents are operable to be selectively blocked to increase air flow through the remaining unblocked vents.

18. The apparatus of claim 17, wherein one or more of the blocked vents are operable to be selectively unblocked to restore air flow through the selected vents.

19. The apparatus of claim 14, wherein the scoop is further configured to allow at least a portion of the air to travel past the scoop to cool one or more heat generating components not coupled to the backplane.

20. The apparatus of claim 14, wherein the scoop is operable to be bent by a user to deflect the at least a portion of the air in a desired direction.

21. The apparatus of claim 20, wherein the scoop is segmented into a plurality of scoop portions and wherein at least two of the plurality of scoop portions are operable to be separately bent by the user to deflect at least a portion of the air in different desired directions.

22. The apparatus of claim 20, wherein the one or more vents comprises at least two or more different sized vents and wherein the scoop is operable to direct at least a portion of the air through the at least two different sized vents.

23. The device of claim 1, wherein the scoop is operable to be bent by a user to deflect the air flow in a desired direction.

* * * * *